(12) United States Patent
Werner et al.

(10) Patent No.: US 8,152,549 B1
(45) Date of Patent: *Apr. 10, 2012

(54) MULTIPLE STEM DESIGN FOR HIGH DENSITY INTERCONNECTS

(75) Inventors: Walter V. Werner, Pittsford, NY (US); Earl W. Stromberg, Roanoke, TX (US); Wit Cezary Bushko, Medway, MA (US); George Hanna Ghanime, Ballston Spa, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/917,118

(22) Filed: Nov. 1, 2010

(51) Int. Cl.
*H01R 25/00* (2006.01)

(52) U.S. Cl. .......................................................... 439/291

(58) Field of Classification Search .................. 439/291, 439/351, 66, 78
See application file for complete search history.

(56) References Cited

U.S. PATENT DOCUMENTS

| | | | |
|---|---|---|---|
| 3,314,044 A | 4/1967 | Powell | |
| 3,526,867 A | 9/1970 | Keeler, II | |
| 4,603,927 A * | 8/1986 | Gardner | 439/78 |
| RE33,005 E * | 8/1989 | Bryce | 439/78 |
| 5,181,632 A | 1/1993 | Latter | |
| 5,299,939 A | 4/1994 | Walker et al. | |
| 5,774,341 A | 6/1998 | Urbish et al. | |
| RE36,442 E | 12/1999 | Kardos | |
| 6,033,250 A | 3/2000 | Pauza | |
| 6,146,151 A * | 11/2000 | Li | 439/66 |
| 6,319,052 B1 | 11/2001 | Chang | |
| 6,655,978 B2 | 12/2003 | Lutsch et al. | |
| 6,932,618 B1 * | 8/2005 | Nelson | 439/66 |
| 7,014,473 B2 | 3/2006 | Millard et al. | |
| 7,323,787 B2 | 1/2008 | Chan | |
| 7,325,302 B2 * | 2/2008 | Mathieu et al. | 29/874 |
| 7,382,142 B2 | 6/2008 | Chong et al. | |
| 7,393,214 B2 | 7/2008 | DiStefano | |
| 7,491,069 B1 | 2/2009 | Di Stefano et al. | |
| 7,500,866 B2 | 3/2009 | Gennai et al. | |
| 7,559,700 B2 | 7/2009 | Eguchi et al. | |
| 7,559,770 B2 | 7/2009 | Di Stefano | |
| 7,579,848 B2 | 8/2009 | Bottoms et al. | |
| 7,837,476 B2 | 11/2010 | Di Stefano | |

(Continued)

OTHER PUBLICATIONS

Commonly owned, co-pending U.S. Appl. No. 12/881,379, filed Sep. 14, 2010; filed specification (as filed) and formal drawings.
Commonly owned, co-pending U.S. Appl. No. 12/905,665, filed Oct. 15, 2010; specification and drawings (as filed).

(Continued)

*Primary Examiner* — Briggitte R Hammond
(74) *Attorney, Agent, or Firm* — Howard IP Law Group, PC

(57) ABSTRACT

A plurality of connecting elements projects from a body's surface. A plurality of indents is defined in the body's surface. Each stem element includes first and second stalks projecting orthogonally from the surface. The first stub includes a pyramidical cap section and at least one generally planar wall. The second stalk is generally parallel to the first stub and spaced apart from the at least one wall, defining a gap therebetween. The second stalk includes a stem projecting from the surface. A lip section extends from a distal end of the stem and protrudes outwardly relative to the stem. An engagement section extends from the lip section. A free end of the engagement section defines a distal end of the second stalk. An outer surface of the engagement section defines a first gradient tapering from the lip section to the distal end of the second stalk.

29 Claims, 10 Drawing Sheets

U.S. PATENT DOCUMENTS

| | | |
|---|---|---|
| 2010/0022105 A1 | 1/2010 | Di Stefano |
| 2010/0075547 A1 | 3/2010 | Lin et al. |
| 2010/0105220 A1 | 4/2010 | Di Stefano |
| 2010/0159753 A1 | 6/2010 | Hsu et al. |
| 2010/0273364 A1 | 10/2010 | Di Stefano |

OTHER PUBLICATIONS

"3M Dual Lock Reclosable Fasteners", 3M, Industrial Business Industrial Adhesives and Tapes Division, St. Paul, MN—55144-1000, Aug. 2005, pp. 1-6.

\* cited by examiner

MULTIPLE STEM DESIGN FOR HIGH DENSITY INTERCONNECTS

FIELD OF INVENTION

The present invention relates generally to interconnect systems, and more particularly, to high density interconnect systems.

BACKGROUND

Fasteners, solders and adhesives have been used to attach components to primary hardware and structures to establish an electrical connection therebetween. For example, integrated circuit (IC) chips are typically soldered to motherboards. However, solders are subject to problems such as cracking which may cause a circuit board to malfunction or to fail. Furthermore, solders conventionally include lead, which may be undesirable in some applications. Adhesives used to connect a component to a primary hardware often require a long cure time. Further, adhesives often employ undesirable solvents for attachment. Moreover, once the component is attached to a structure using solder or adhesive, the component may not be repositioned without damaging the component and/or the structure.

Other options include coating the surface of mechanical interconnects with an electrically conductive material. Several of the known mechanical interconnect systems include hook and loop fasteners available under the trademark Velcro® from Velcro USA, Inc., Manchester, N.H. and reclosable fasteners available under the trademark 3M™ Dual Lok™ from 3M, St. Paul, Minneapolis. However, such mechanical fasteners suffer from disadvantages such as unpredictable contact area, which may prove detrimental to consistent high electrical conductivity, and insufficient locking strength. These fasteners are also subject to frictional locking which may deform the fasteners upon multiple engagement/disengagement cycles. Such fasteners provide rather limited holding force that rapidly decreases with repeated cycles of engagement and disengagement. Alternatives are, therefore, desirable.

SUMMARY

According to an embodiment of the invention, an article of manufacture includes a plurality of regularly spaced connecting elements projecting from a surface of the article and a plurality of regularly spaced indents in the surface. Each of the plurality of indents is adjacent to a corresponding connecting element of the plurality of connecting elements. Each connecting element of the plurality of connecting elements includes a first stub and at least one second stalk projecting substantially orthogonally from the surface. The first stub includes at least one generally planar wall and a pyramidical cap section. The at least one second stalk is separated from the at least one generally planar wall defining a first gap therebetween. The at least one second stalk includes a stem projecting substantially orthogonally, at a proximal end thereof, from the surface. A lip section extends from a distal end of the stem and protrudes outwardly relative to the stem. An engagement section extends from the lip section. A free end of the engagement section defines a distal end of the at least one second stalk. An outer surface of the engagement section defines a first gradient tapering from the lip section to the distal end of the second stalk. Each of the plurality of indents is adapted to receive a pyramidical cap section of a corresponding connecting element projecting from another article.

The wall thickness of the engagement section decreases continuously from a first wall thickness of the lip section to a second wall thickness of the distal end of the second stalk. The wall thickness of the lip section decreases continuously from the first wall thickness of the lip section to a third wall thickness at the distal end of the stem.

According to another embodiment of the invention, a system includes a first interconnecting article having a first plurality of regularly spaced connecting elements projecting from a first surface thereof and a plurality of regularly spaced indents defined in the first surface and interspersed between the first plurality of connecting elements. The system further includes a second interconnecting article configured for connecting with the first interconnecting article and has a second plurality of regularly spaced connecting elements projecting from a second surface thereof and a second plurality of regularly spaced indents defined in the second surface and interspersed between the second plurality of connecting elements. Each connecting element of the first and second pluralities of connecting elements includes a first stub and at least one second stalk projecting substantially orthogonally from one of the first and second surfaces. The first stalk includes at least one generally planar wall and a pyramidical cap section. The at least one second stalk is separated from the at least one generally planar wall by a first gap. The second stalk includes a stem projecting generally orthogonally, at a proximal end thereof, from one of the first and second surfaces. A lip section having extends from a distal end of the stem and protrudes outwardly relative to the stem. An engagement section extends from the lip section. A free end of the engagement section defines a distal end of the at least one second stalk. An outer surface of the engagement section defines a first gradient tapering from the lip section to the distal end of the at least one second stalk. Each of the first and second pluralities of indents is adapted for receiving a pyramidical cap section of a corresponding connecting element of one of the first and second pluralities of connecting elements.

When the second article is superposed on the first article such that the pyramidical cap sections of the second plurality of connecting elements are in general contact engagement with the pyramidical cap sections of the first plurality of connecting elements, a sub-set of connecting elements of the first plurality of connecting elements defines a second central gap and accommodates a connecting element of the second plurality of connecting elements therein, upon application of a first force greater than a first predetermined threshold on at least one of the first and second articles urging the at least one of the first and second articles toward the other of the first and second articles.

Application of a second force greater than a second predetermined threshold on at least one of the first and second articles in a direction opposite of the first force causes the connecting element of the second plurality of connecting elements to be released from the sub-set of the first plurality of connecting elements.

An electrical interconnect apparatus includes a substrate and a plurality of regularly spaced connecting elements projecting from the substrate. Each of the plurality of connecting elements includes a first stub projecting substantially orthogonally from the substrate and having at least one generally planar wall and a pyramidical cap section. At least one second stalk projects from the surface and is separated from the at least one generally planar wall defining a first gap. The at least one second stalk includes a stem projecting substantially orthogonally, at a proximal end thereof, from the substrate. A lip section having a first wall thickness extends from a distal end of the stem. The first wall thickness is greater than a second wall thickness of the stem at the distal end. An engagement section extends from the lip section. A free end of the engagement section having a third wall thickness defines a distal end of the at least one second stalk. The wall thickness of the engagement section decreases from the first wall thickness at the lip section to the third wall thickness at the distal end of the second stalk.

According to an embodiment of the invention, a plurality of regularly spaced indents are interspersed between the first plurality of connecting elements. Each of the plurality of the indents is configured to receive and accommodate a pyramidical cap section of the first stub of a connecting element projecting from another electrical interconnect apparatus. in general contact engagement therewith. Each of the plurality of indents is adjacent to at least one stem element of the plurality of connecting elements.

BRIEF DESCRIPTION OF THE DRAWINGS

Understanding of the present invention will be facilitated by consideration of the following detailed description of the exemplary embodiments of the present invention taken in conjunction with the accompanying drawings, in which like numerals refer to like parts and in which.

DETAILED DESCRIPTION

It is to be understood that the figures and descriptions of the present invention have been simplified to illustrate elements that are relevant for a clear understanding of the present invention, while eliminating, for purposes of clarity, many other elements found in such reclosable fasteners and interconnecting surfaces. However, because such elements are well known in the art, and because they do not facilitate a better understanding of the present invention, a discussion of such elements is not provided herein. The disclosure herein is directed to all such variations and modifications known to those skilled in the art.

Figure 1:
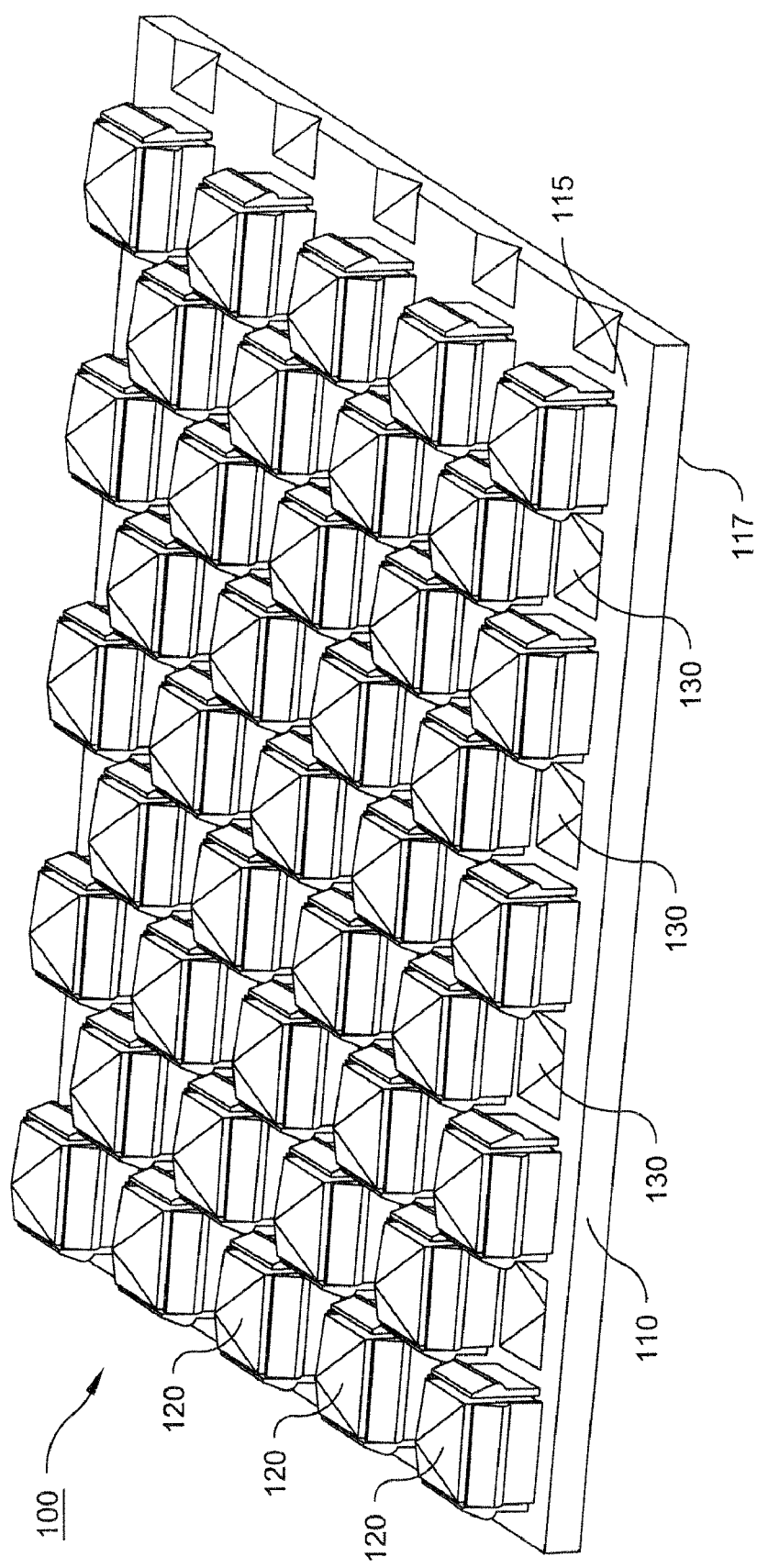
FIG. 1 is a perspective view of an interconnecting body with a plurality of stem elements and a plurality of indents, according to an embodiment of the invention.

Referring to FIG. 1, an interconnecting body 100 is illustrated, according to an embodiment of the invention. Body 100 includes a base 110, a plurality of regularly spaced connecting elements or stem elements 120, of like dimensions, and a plurality of regularly spaced indents 130, also of like dimensions, in base 110. Each of the plurality of connecting elements or stem elements 120 projects generally orthogonally from a first surface 115 of base 110. Each of the plurality of indents 130 is defined, adjacent to a corresponding connecting element 120, in first surface 115 of base 110. A second surface 117 of base 110 may be configured to be affixed or otherwise fastened to a component or a structure. In the illustrated embodiment, base 110 is a generally flat, planar substrate. In other embodiments, base 110 may take the form of a substrate having a curved profile. In yet other configurations, base 110 may take the form of an outer skin of one or more mechanical structures or electrical components such as circuit boards.

In an exemplary embodiment, body 100 may be fabricated from engineering plastics using, for example, high tolerance injection molding processes, such as those currently in use for compact disc (CD) and Digital Video Disc (DVD) manufacture. Non-limiting examples of engineering plastics suitable for fabrication of body 100 include polycarbonates (PC), acrylonitrile butadiene styrene (ABS), polyamides (PA), polybutylene terephthalate (PBT), polyethylene terephthalate (PET), polyphenylene oxide (PPO), polysulpone (PSU), polyetherketone (PEK), polyetheretherketone (PEEK), polyimides and polyphenylene sulphide (PPS). Other suitable materials include materials having high heat resistance, mechanical strength, rigidity, chemical stability and flame retardancy. In an exemplary embodiment, body 100 including stem elements 120 may be fabricated from an electrically conductive material. In an exemplary embodiment, a non-conductive plastic body 100 may be surface coated with a nano-composite material such as a carbon nanotube composite or with metallic nano-spheres for imparting and electrical conductivity to the embodiment. Since such coatings are known in the art, they are not described in detail for sake of brevity. In another embodiment, stem elements may be fabricated from an electrically conductive composite. Examples of electrically conductive composite include, but are not limited to, plastics that contain additives that impart such conductivity via inclusion of metallic powders, carbon black, carbon fibers, mats, and metalized glass fibers and spheres.

In another configuration, body 100 including stem elements 120 may be fabricated from a thermally conductive material, for example, from carbon nanotube based composites. In another embodiment, the surface of body 100 or at least stem elements 120 may be coated with a thermally conductive material such as a carbon nanotube composite or with metallic spheres. In an exemplary embodiment, at least first stalk or stub 140 of a stem element 120 may be fabricated from an optically conductive material.

Figure 2:
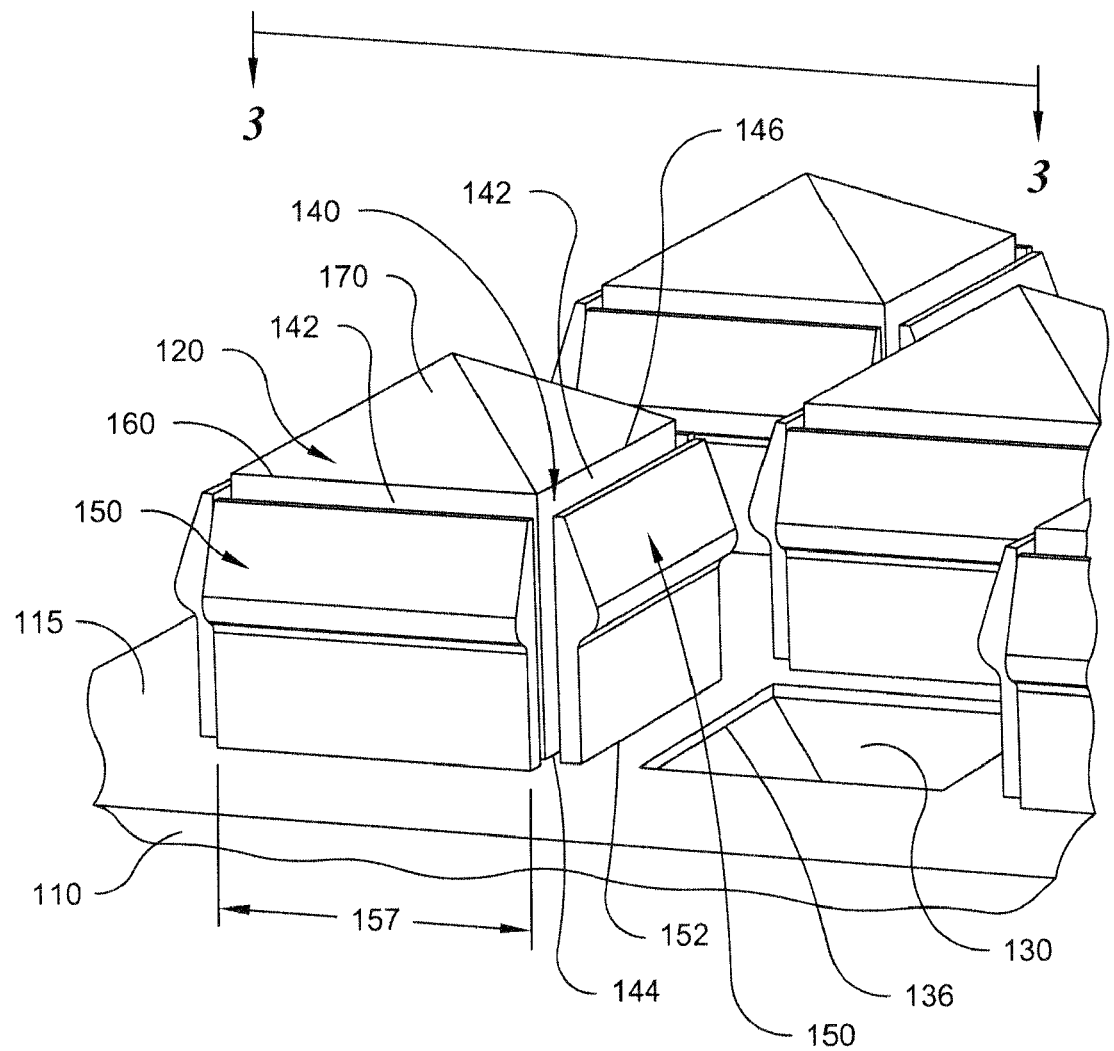
FIG. 2 is a partial perspective view of the interconnecting body of FIG. 1.
Figure 3:
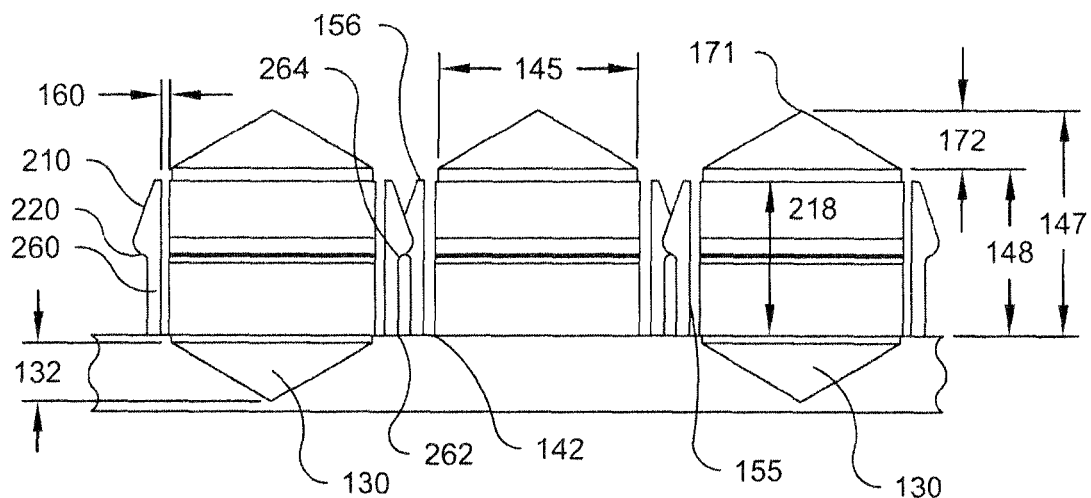
FIG. 3 is a partial side view of the interconnecting body of FIG. 1, according to an embodiment of the invention.
Figure 4:
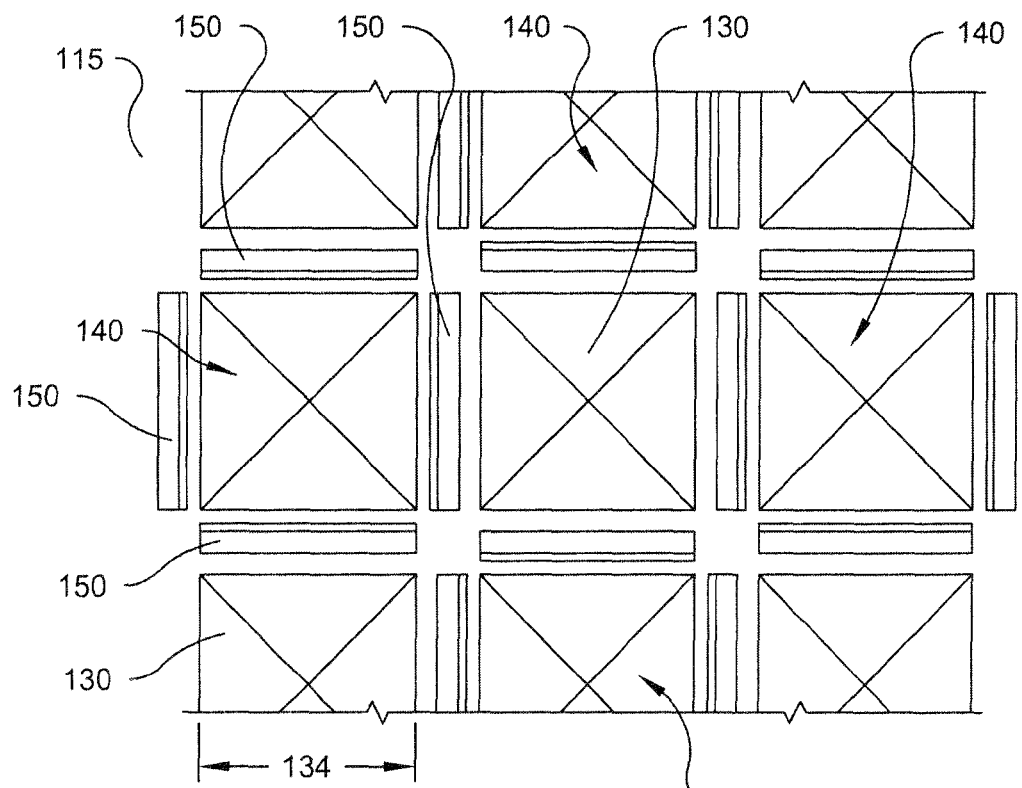
FIG. 4 is a partial top view of the interconnecting body of FIG. 1, according to an embodiment of the invention.

Referring now to FIGS. 2-4, stem element 120 includes a first stalk or stub 140 and at least one second stalk 150, both projecting generally orthogonally from surface 115. In an exemplary embodiment, first stalk or stub 140 is a solid stalk. In another embodiment, first stalk 140 may be a hollow stalk. In the illustrated embodiment, first stalk 140 has a generally square cross-section having a width 145 (of FIG. 3) and has four generally planar faces or walls 142. In another embodiment, first stalk 140 may have a triangular cross-section having three generally planar faces or walls 142. In yet other embodiment, first stalk 140 may have a cross-section shape and configured as a polygon. First stalk 140 is coalesced, at an end 144, to, and extends from, surface 115 of base 110. First stalk 140 further includes a pyramidical cap section 170. Pyramidical cap section 170 is coalesced to, and extends from, a base 160 at a second end 146 of first stalk 140. In the illustrated embodiment, wherein first stalk 140 has a square cross-section, pyramidical cap section 170 has a square base 160. In another configuration, wherein first stalk 140 has a triangular cross-section, pyramidical cap section 170 has a triangular base 160. First stalk 140 has a first height 148 between ends 144, 146. Pyramidical cap section 170 has a height 172. First stalk 140 has a second height 147 between an apex 171 of pyramidical cap section 170 and end 144. In the illustrated embodiment, first stalk 140 is a unitary, monolithic structure coalesced to and extending from base 110.

In one configuration, second stalk 150 is a relatively slender stalk and is generally parallel with a generally planar face 142 of first stalk 140. Second stalk 150 is spaced apart from face 142 of first stalk 140, defining a gap 155. In the illustrated embodiment, where first stalk 140 has four generally planar faces 142, stem element 120 has four stalks 150, each of which is generally parallel to a corresponding face 142. Second stalk 150 is coalesced, at an end 152, to and extends from surface 115 of base 110. In an exemplary embodiment, second stalk 150 has a generally uniform wall thickness 151 between ends 152, 154. In other embodiments, second stalk 150 may have a non-uniform wall thickness 151, depending on the requirements of a given application. Second stalk 150 has a width 157. In one configuration, width 157 of second stalk 150 is generally equal to width 145 of first stalk 140. In other configurations, width 157 of second stalk 150 may be less than width 145 of first stalk 140. In the illustrated embodiment, second stalk 150 is a unitary, monolithic structure coalesced to and extending from base 110.

Figure 5A:
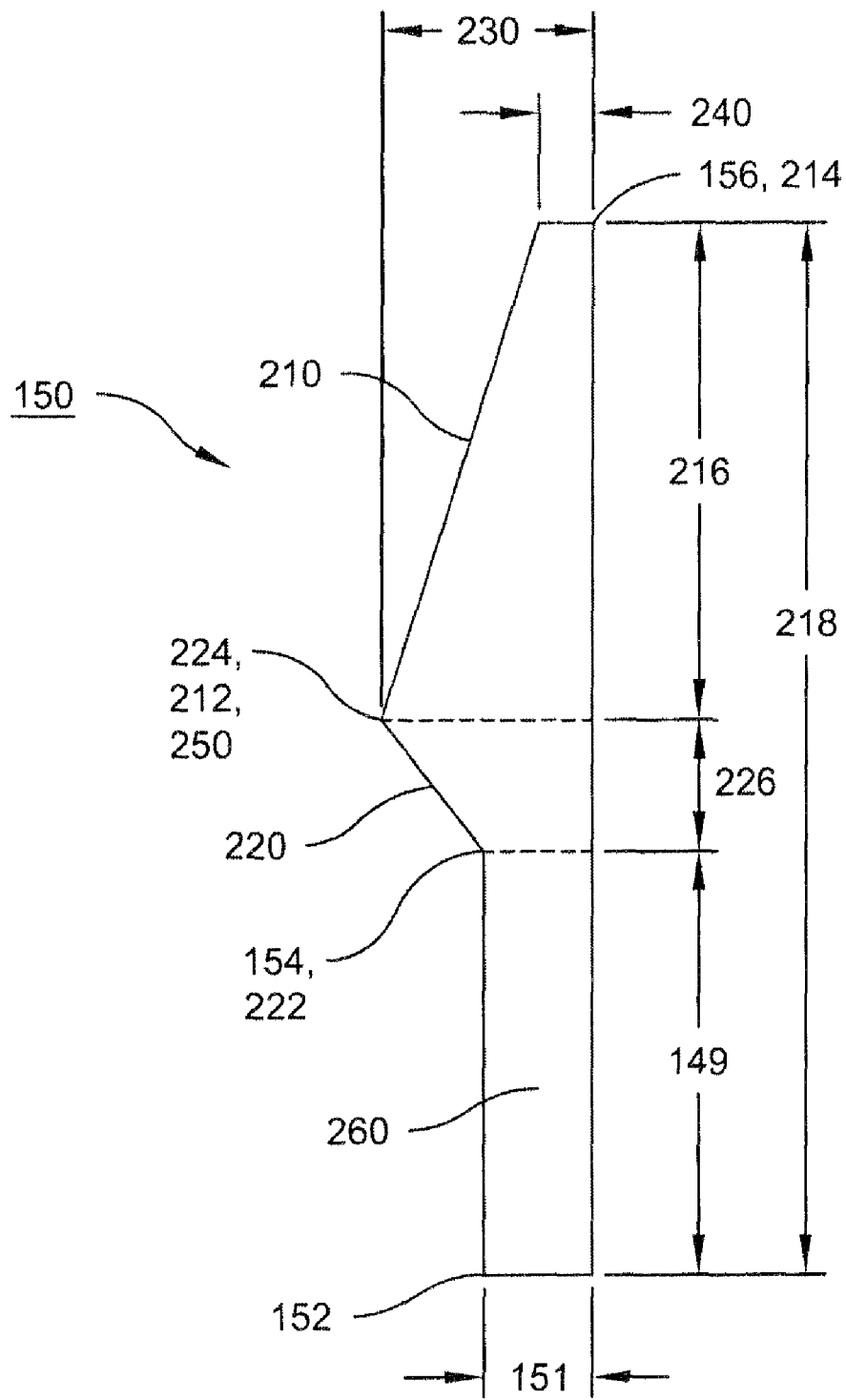
FIG. 5A is a schematic side view of a second stalk of the stem element of FIG. 1, according to an embodiment of the invention.

Referring now to FIG. 5A, second stalk 150 is schematically illustrated, according to an embodiment of the invention. Second stalk 150 includes a stem 260, a lip section 250, a disengagement section or locking section 220 and an engagement section 210, according to an embodiment of the invention. Stem 260 is coalesced to and extends from surface 115 and has a wall thickness 151. Stem 260 has a first end 152 and a second end 154 and has a height 149 which is the distance between ends 152, 154. At a first end 222, lip section 250 is coalesced to, and extends from, end 154 of stem 260. Disengagement section 220 is defined between lip section 250 and stem 260 and extends from first end 222 to a second end 224. At a first end 212, engagement section 210 is coalesced to and extends from lip section 250, corresponding to second end 224 of disengagement section 220. Engagement section 210, thus, extends between first 212 and second end 214. Second stalk 150 has a height 218 which is the distance between ends 152 and 214.

Cap section 170 acts as an alignment mechanism for guiding a corresponding cap section (not shown) of a stem element (not shown) projecting from a second body (not shown) superposed on body 100 toward a central gap (not shown) defined by adjacent stem elements 120. Engagement section 210 is configured to engage a corresponding engagement section (not shown) of the stem element (not shown) projecting from the second body superposed on body 100 and, responsive to an engagement therebetween, provides a bending force urging second stalk 150 in a radial direction toward first stalk 140. Engagement section 210, thus, serves to bend second stalk 150 inwardly 160, to facilitate the entry of the stem element (not shown) into the gap (not shown) defined by adjacent stem elements 120 by widening the central gap (not shown). Engagement section 210, by providing the bending forces, also reduces the kinematic friction between the engaging stem elements. Disengagement section 220 serves to engage a corresponding disengagement section 220 of the stem element (not shown) extending from the second body (not shown) superposed on body 100 and provide a holding force resisting the movement of the stem element (not shown) of the second interconnecting body (not shown) out of the gap defined by adjacent open stems 120, when the interconnecting bodies are subject to a disengaging force pulling at least one of them away from the other body.

Figure 5B:
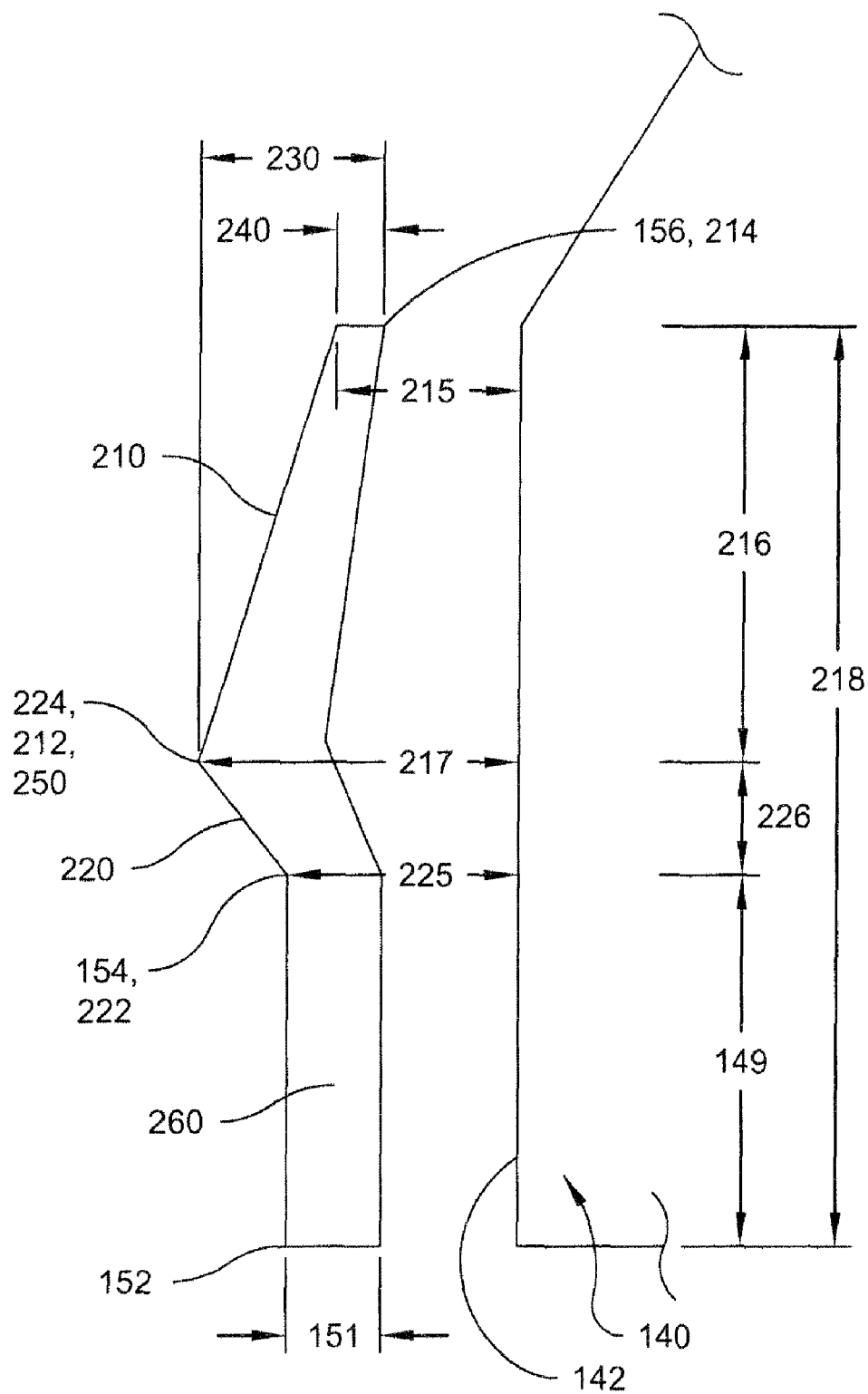
FIG. 5B is a schematic side view of a second stalk of the stem element of FIG. 1, according to another embodiment of the invention.

Engagement section 210 has an inclined outer surface for engaging a corresponding engagement section (not shown) of the stem element (not shown) projecting from the second body (not shown) superposed on body 100 (of FIG. 1). In an exemplary embodiment, engagement section 210 has a tapered cross-section having a first maximum wall thickness 230 at first end 212 and a second minimum wall thickness 240 at second end 214. The wall thickness of engagement section 210, thus, varies in a non-linear, continuously increasing fashion from second wall thickness 240 at second end 214 to first wall thickness 230 at first end 212. Thus, engagement section 210 has a first gradient defined from second end 214 to first end 212. The first gradient of engagement section 210 may be derived as the difference, between first wall thickness 230 and second wall thickness 240, divided by a length 216 of engagement section 210. In another embodiment illustrated in FIG. 5B, first gradient of engagement section 210 may be determined as a function of linear distances from generally planar face 142. For instance, the linear distance of a point on the outer surface of engagement section 210 at end 214 is designated by reference numeral 215 and the linear distance of a point on the outer surface of lip section 250 at end 212 is designated by reference numeral 217. The first gradient may be determined by dividing the difference between the linear distances 215, 217 by length 216 of engagement section 210.

At a second end 224, disengagement section or locking section 220 is coalesced to and extends from first end 212 of engagement section 210 and, at a first end 222, coalesces into end 144 of stem 260. Disengagement section 220 has an inclined outer surface for engaging a corresponding disengagement section (not shown) of a stem element (not shown) projecting from the second body (not shown) superposed on body 100 (of FIG. 1), when the stem element (not shown) is lodged in the central gap (not shown) defined by adjacent stem elements 120. In an exemplary configuration, disengagement section 220 has a tapered cross-section having a first maximum wall thickness 230 at second end 224 and a second minimum wall thickness 151 at first end 222. The thickness of disengagement section 220, thus, varies in a non-linear, continuously decreasing fashion from first wall thickness 230 at lip section 250 to second wall thickness 151 at first end 222. Thus, disengagement section 220 has a second gradient defined from first end 222 to second end 224. The second gradient of disengagement section 220 may be derived as the difference, between first wall thickness 230 and second wall thickness 147, divided by a length 226 of disengagement section 220. In an exemplary embodiment, the second gradient of disengagement section 220 is greater than the first gradient of engagement section 210. In another embodiment illustrated in FIG. 5B, second gradient of disengagement section 220 may be determined as a function of linear distances from generally planar face 142. For instance, the linear distance of a point on the outer surface of lip section 250 at end 224 is designated by reference numeral 217 and the linear distance of a point on the outer surface of stem 260 at distal end 154 is designated by reference numeral 225. The second gradient may be determined by dividing the difference between the linear distances 217, 225 by length 226 of disengagement section 220.

Cap section 170 has a height 172 from base 160 to an apex 171. In an exemplary embodiment, a height 148 of first stalk is greater than a height 218 of second stalk 150.

Referring again to FIGS. 2-4, plurality of indents 130 are illustrated in first surface 115 of base 110, according to an embodiment of the invention. Each second stalk 150 of stem element 120 has one adjacent indent 130 in first surface 115. In the illustrated embodiment, first stalk 140 has a square cross-section and, therefore, indent 130 has a corresponding square opening 136 in first surface 115. Indent 130 has a profile complementary to cap section 170 and is, therefore, adapted to receive and accommodate therein a cap section 170 of first stub 140 projecting from another surface or substrate (not shown). Indent 130 has a depth 132. Depth 132 of indent 130 is generally equal to height 172 of pyramidical cap section 170 and width 134 of indent 130 is generally equal to width 145 of first stalk 140. In the illustrated embodiment, each indent 130 is surrounded by four stem elements 120. In another configuration, first stalk 140 may have a triangular cross-section, in which case, indent 130 has a corresponding triangular opening in first surface 115. Furthermore, in the triangular configuration, each indent 130 may be surrounded by three stem elements 120.

The following exemplary dimensions for stem elements 120 are for the illustrated embodiment wherein first stalk 140 has a square cross-section. In an exemplary embodiment, first stalk 140 having may have width 145 of about 150 microns (μm) and height 148 of about 120 μm, by way of non-limiting examples only. Cap section 170 may have a height 172 about 45 μm. In one configuration, stem 260 of second stalk 150 may have a width 157 of about 150 μm and wall thickness 151 of about 8 μm. Engagement section 210 may have height 216 of about 45 μm, second wall thickness 240 ranging from about 1 μm to about 5 μm and first wall thickness 230 of about 16 μm in an exemplary configuration. Disengagement section 220 may have length 226 of about 10 μm, first wall thickness 151 of about 8 μm and second wall thickness 230 of about 16 μm, in an exemplary embodiment. Gap 155 may be of about 20 μm, which may be generally equal to wall thickness 151 of stem 260, in an exemplary configuration.

In an exemplary embodiment, engagement section 210 may have a first gradient of about 0.8 and disengagement section 220 may have a second gradient of about 1.2. In one configuration, the ratio of the second gradient of disengagement section 220 to the first gradient of engagement section 210 may range from about 1.5 to about 3. The ratio of width 145 of first stalk 140 to wall thickness 151 of second stalk 150 may range from about 15 to about 25. The ratio of width 145 of first stalk 140 to gap 155 may range from about 5 to about 10. The ratio of wall thickness 151 of second stalk 150 to height 218 of second stalk 150 may range from about 8 to about 12. The ratio of width 157 of second stalk 150 to wall thickness 151 of second stalk 150 may range from about 15 to about 25. The ratio of width 145 of first stalk 140 to width 157 of second stalk 150 may range from about 0.9 to about 1.1. Indent 130 may have depth 132 of about 20 μm and a width 134 of about 150 μm. It will be understood that different dimensions and ratios may be selected for first stalk 140 and second stalk 150, depending on the requirements of a given application and that the exemplary values provided above are non-limiting in nature. One skilled in the art will further appreciate that the given dimensions may be scaled down to nanometer levels by a factor of about 1000 as well as scaled up to millimeter levels by a factor of about 1000 without departing from the scope of the invention.

Figure 6A:
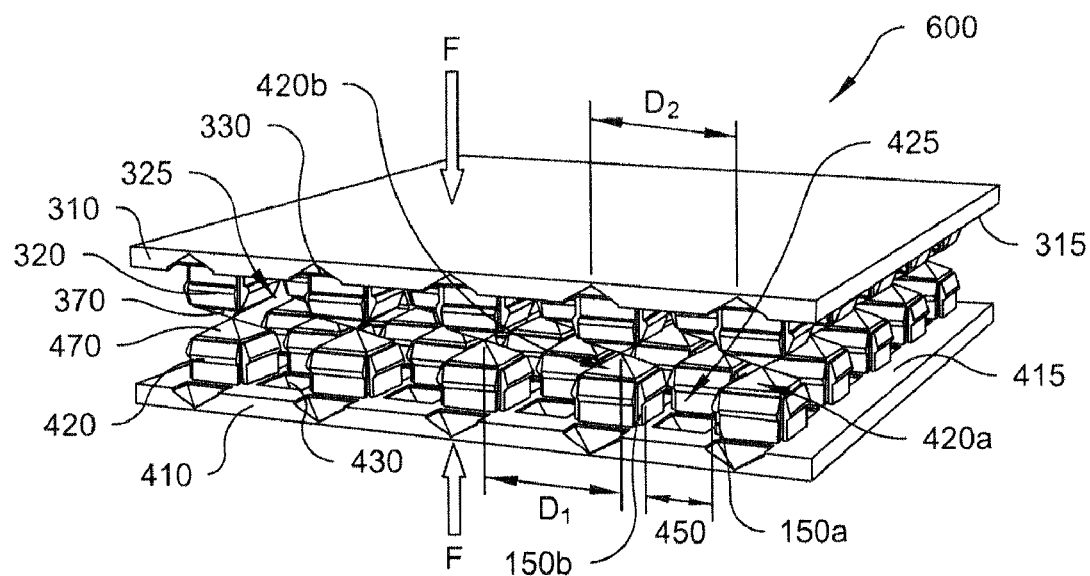
FIG. 6A illustrates first and second interconnecting bodies during a stage of engagement, according to an embodiment of the invention.
Figure 6B:
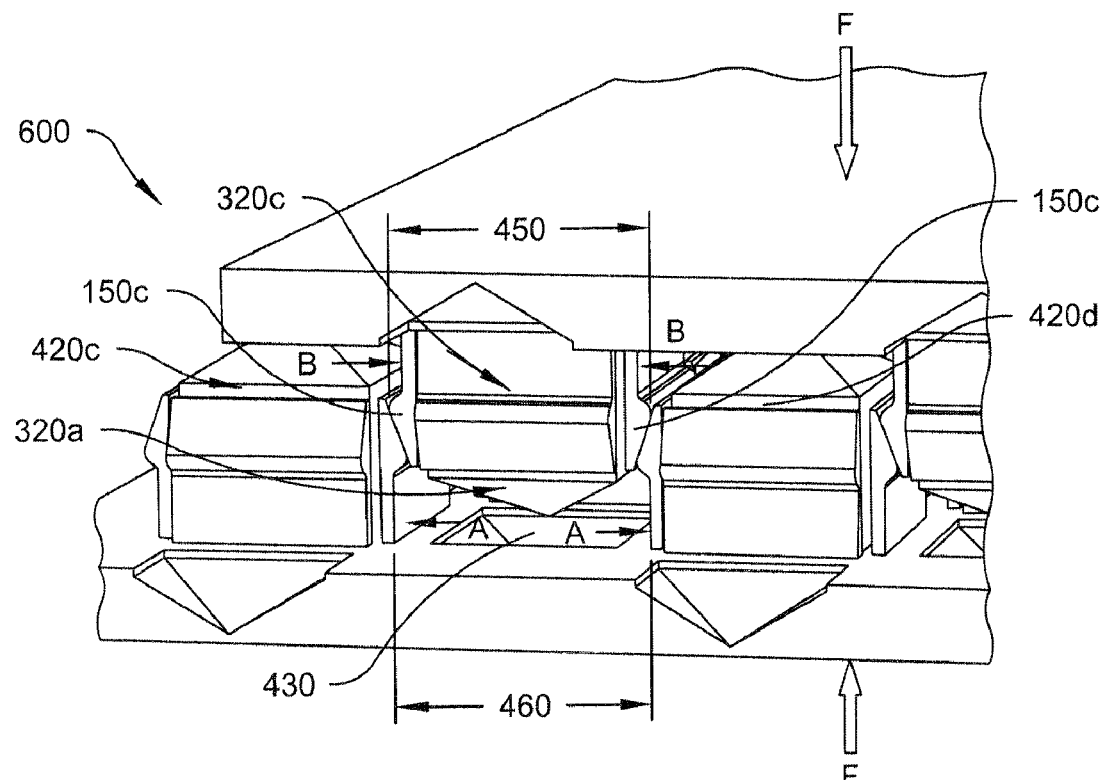
FIG. 6B illustrates the first and second interconnecting bodies of FIG. 5A during a stage of engagement, according to an embodiment of the invention.
Figure 6C:
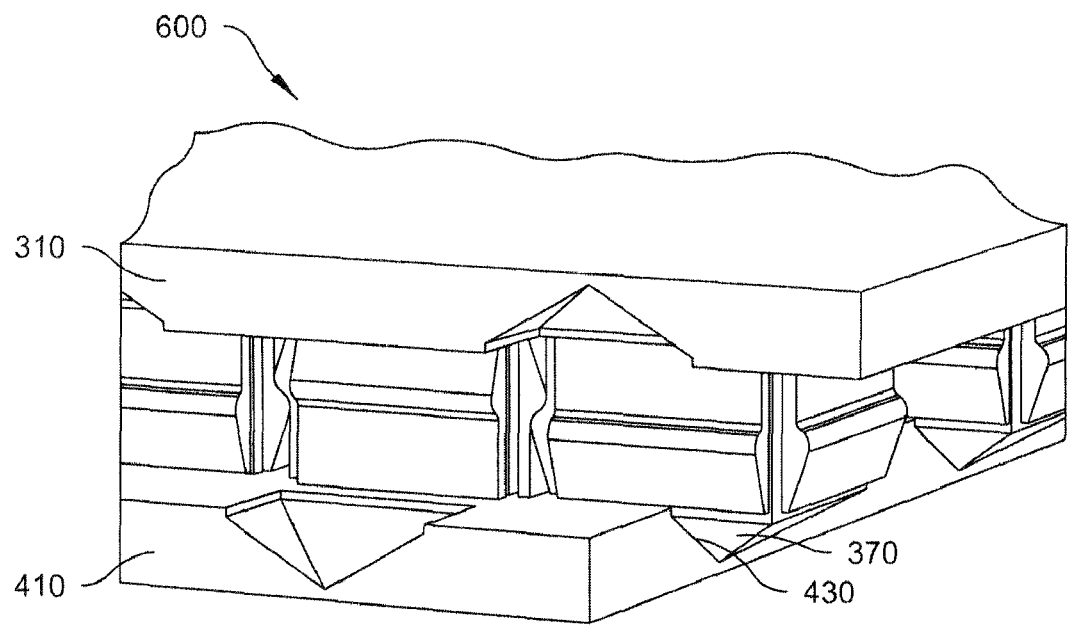
FIG. 6C illustrates the first and second interconnecting bodies of FIG. 5A during a state of engagement, according to an embodiment of the invention.

Referring now to FIGS. 6A-6C, a system 600 including first and second interconnecting bodies 310, 410 is illustrated, according to an embodiment of the invention. Each of first and second interconnecting bodies 310, 410 has a corresponding first and second plurality of regularly spaced stem elements or connecting elements 320, 420, of like dimensions, projecting generally orthogonally from respective first and second surfaces 315, 415. A corresponding first and second pluralities of regularly spaced indents 330, 430, also of like dimensions, are defined in respective first and second surfaces 315, 415. Each of the first and second pluralities of stem elements 320, 420 is spaced apart from adjacent stem elements by a predetermined distance $D_1$. Likewise, each of first and second pluralities of indents 330, 430 are spaced apart by predetermined distance $D_2$. In an exemplary embodiment, distances $D_1$, $D_2$ may be equal to each other. Adjacent second stalks $150_a$, $150_b$ of respective adjacent stem elements $420_a$, $420_b$ are separated by a maximum distance 430 about their respective lip sections 250 (of FIG. 5) and by a minimum distance 460 about their stems 260 (of FIG. 2). Opposing second stalks $150_c$, $150_c$ of stem element $320_a$ are separated by a distance 450 about their respective lip sections 250. Maximum distance 430 between two adjacent second stalks $150_a$, $150_b$ of respective adjacent stem elements $420_a$, $420_b$ is smaller than distance 450 between opposing second stalks $150_c$, $150_c$ about their respective lip sections 250, whereas minimum distance 460 between two adjacent stems 260 (of FIG. 2) of respective adjacent stem elements $420_a$, $420_b$ is greater than distance 450 between opposing second stalks $150_c$, $150_c$ about their respective lip sections 250.

In the illustrated embodiment, a sub-set $420_a$, $420_b$ of plurality of stem elements 420 of body 410 define a central gap 425 therebetween to receive and accommodate one stem element $320_a$ projecting from body 310. Likewise, a sub-set (not shown) of plurality of stem elements 320 of body 310 define a central gap (not shown) therebetween to receive and accommodate at least one stem element $420_a$ projecting from body 410.

First and second bodies 310, 410 are positioned such that cap sections 170 of first plurality of connecting elements 320 are in general contact engagement with cap sections 170 of second plurality of connecting elements 420. Upon application of an engagement force F on at least one of first and second bodies 410, 310, at least one of second plurality of stem elements $320_a$ is received and accommodated by central gap 425 defined by sub-set $420_a$, $420_b$ of first plurality of stem elements 420 and at least one of first plurality of stem elements 420 is received and accommodated by the central gap (not shown) defined by a sub-set (not shown) of second plurality of stem elements 320. Bodies 410, 310 are interconnected with each other via first and second pluralities of stem elements 420, 320, as described in detail below.

When first body 310 is superposed over second body 410, pyramidical cap section 370 of stem element $320_a$ and pyramidical cap section 470 of stem element $420_a$ contact each other in a first stage of engagement. Pyramidical cap sections 370, 470 by virtue of their pyramidical shapes act as alignment mechanisms and guide stem elements $420_a$, $320_a$ towards respective central gaps 425, 325. As a result, pyramidical cap sections 370, 470 enter the respective central gaps 425, 325, wherein respective engagement sections 210 of stem elements $420_a$, $320_a$ engage each other. As set forth above, the distance between lip sections 250 of adjacent second stalks $420_a$, $420_b$ is smaller than the distance 450 between opposing second stalks $150_c$. Consequently, stem elements $420_a$, $320_a$ encounter resistance to further progress of stem elements $420_a$, $320_a$ into respective central gaps 325, 425. However, a continuous application of engagement force F and the tapered complementary profiles of engagement sections 210 cause bending forces to be applied on stems 260 (of FIG. 2) of stem elements $420_a$, $320_a$. When engagement force F exceeds a first predetermined threshold, the bending forces are sufficient to permit the entry of stem element $420_a$, $320_a$ into respective central gaps 325, 425.

Given the relatively slender thickness 151 of stem 260 (of FIG. 5) compared to height 218 (of FIG. 5), engagement force F causes adjacent second stalks 150 of stem element $420_c$, $420_d$ to be pushed inward toward their respective first stalks 140 as shown by arrows A-A. Simultaneously, opposing second stalks 150 of stem element 320, are pushed inward toward first stalk 140 as shown by arrows B-B. Thus, maximum distance 430 between adjacent second stalks 150 of stem elements $420_c$, $420_d$ increases sufficiently to permit the entry of stem element 320, into central gap 425. Finally, as the application of engagement force F is continued, pyramidical cap section 470 is received and accommodated by an indent (not shown) in surface 315 and pyramidical cap section 370 is received and accommodated by, as illustrated in FIG. 6C. At this stage, disengagement sections 220 of stem elements 320, 420 engage each other and lock stem elements 320, 420 in respective central gaps 425, 325. First and second bodies 410, 310 are thus interconnected.

Because the second gradient of disengagement section 220 is relatively greater than the first gradient of engagement section 210, a disengagement force required to pull stem element $420_a$ out of central gap 325 in a direction opposite to that of the engagement force is greater than the engagement force required to insert stem element $420_a$ into central gap 325.

Figure 7:
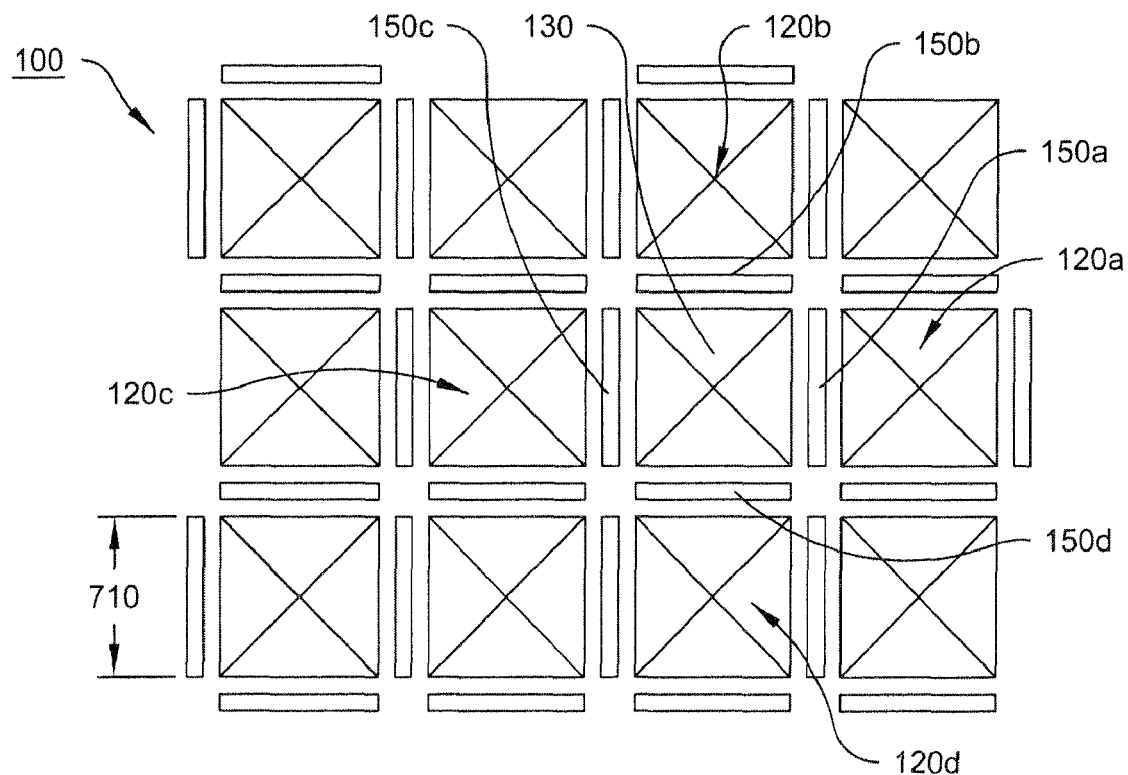
FIG. 7 is a schematic top view of an interconnecting body with a plurality of stem elements and a plurality of indents arranged in a square pattern, according to an embodiment of the invention.

Referring now to FIG. 7, stem elements 120 are arranged in a square pattern as described below, in an embodiment of the invention. Any four adjacent second stalks $150_a$, $150_b$, $150_c$, $150_d$ of the plurality of stem elements of 120, for instance, stem elements $120_a$, $120_b$, $120_c$, $120_d$, which define a central gap 425 for receiving and accommodating stem element $320_a$ and surround an indent 130, define the vertices of a square. Thus, in a square pattern, each stem element $120_a$ of body 100 engages four stem elements (not shown) of a superposed corresponding interconnecting surface (not shown). A width 710 of second stalk $150_a$ is equal to a width 710 of second stalk $150_b$, to a width 710 of second stalk $150_c$ and to a width 710 of second stalk $150_d$.

Figure 8A:
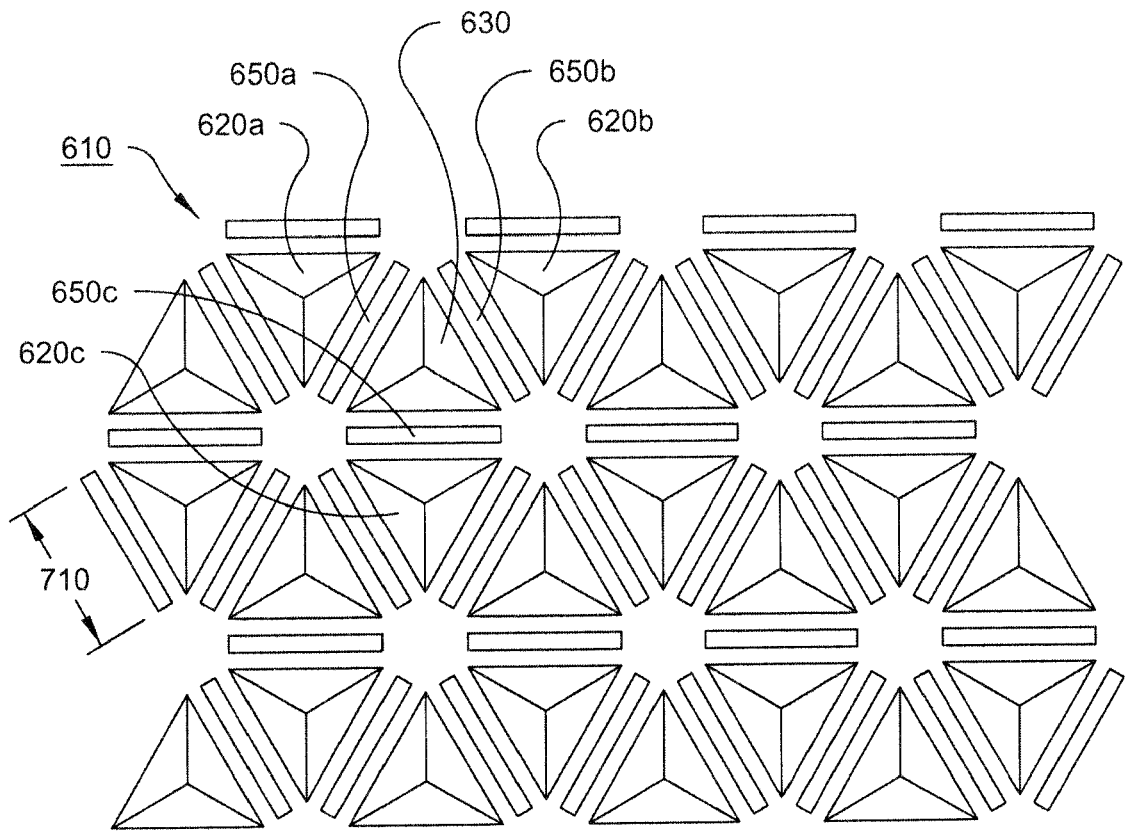
FIG. 8A is a schematic top view of an interconnecting body with a plurality of stem elements and a plurality of indents arranged in a triangle pattern, according to an embodiment of the invention.

Now referring to FIG. 8A, stem elements $620_a$, $620_b$, $620_c$ of interconnecting body 610 are arranged in a triangle pattern as described below, according to another embodiment of the invention. Any three adjacent second stalks $650_a$, $650_b$, $650_c$ of stem elements $620_a$, $620_b$, $620_c$, which define a central gap 625 for receiving and accommodating a stem element (not shown) projecting from another body (not shown), and surround an indent 630, define the vertices of an equilateral triangle. Central gap 625 receives and accommodates a stem element (not shown) of a superposed interconnecting body (not shown). Thus, in a triangle pattern, each stem element (not shown) of a body (not shown) engages three stem elements $620_a$, $620_b$, $620_c$ of body 610. Width 710 of first stalk $650_a$ is equal to width 710 of second stalk $650_b$ and to width 710 of third stalk $650_c$.

Figure 8B:
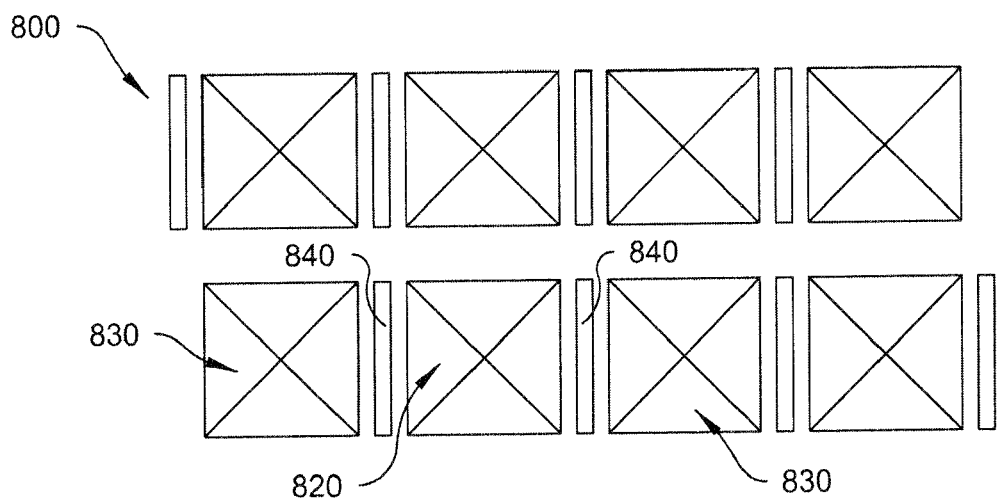
FIG. 8B is a schematic top view of an interconnecting body with a plurality of stem elements and a plurality of indents arranged in a square pattern, according to another embodiment of the invention.

Referring now to FIG. 8B, another embodiment of an interconnecting body 800 is illustrated. Stem elements 820 and indents 830 are arranged in a generally linear fashion on an outer surface of body 800. In the illustrated embodiment, each stem element 820 has first and second opposing second stalks 840. Any two adjacent stem elements 820 define a central gap therebetween to receive a stem element (not shown) projecting from a body (not shown) superposed on body 800.

In other embodiments, stem elements 120 may be arranged in different patterns, such as pentagon, hexagon and other geometrical patterns, depending on the requirements of a given application. It will be appreciated that square and triangle patterns of stem elements result in a tight pattern, having higher density, as compared to other polygonal patterns.

Figure 9:
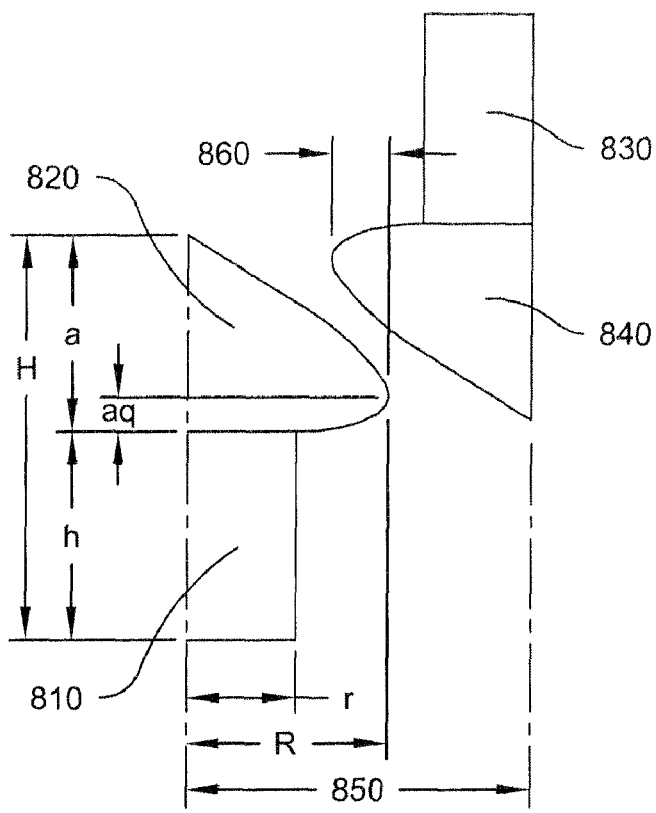
FIG. 9 is a schematic cross-sectional view of two conventional solid stems interacting with one another.

Referring now to FIG. 9, two conventional solid stems 810, 830 in prior art reclosable fastener surfaces are schematically illustrated. Stem 810 has a mushroom head 820 and stem 830 has a mushroom head 840. For a given radius R of mushroom heads 820, 840 and a given distance 850 between stems 810, 830, an overlap 860 is given by:

Overlap=2R−Distance between two stems.

Figure 10A:
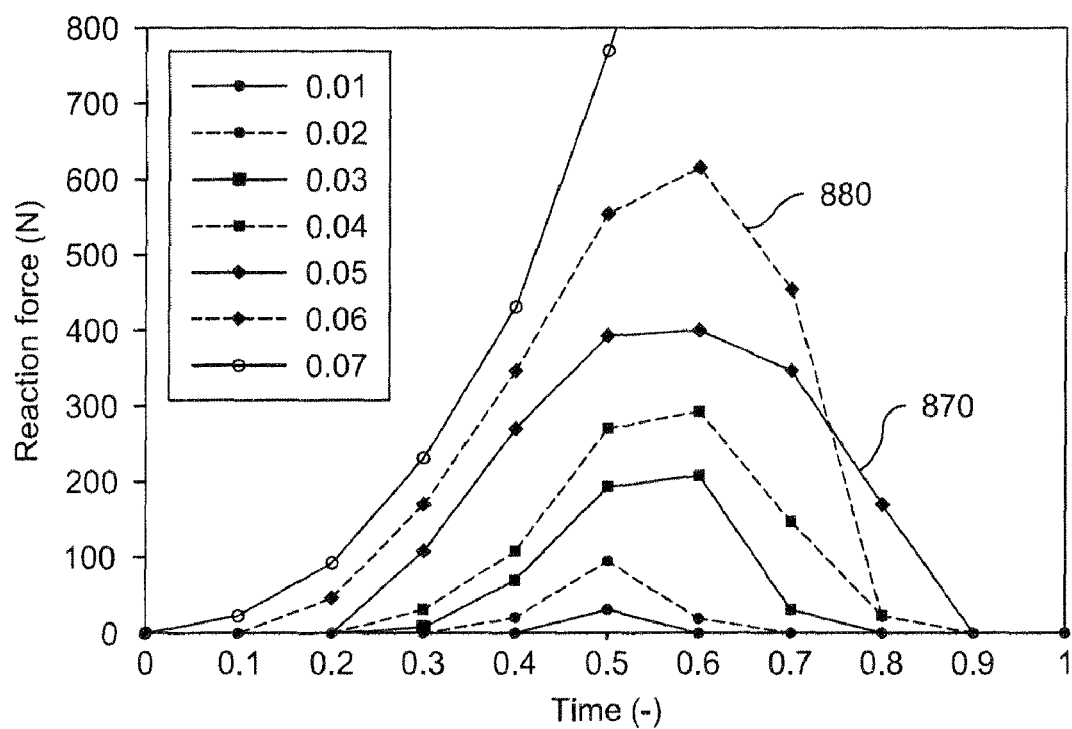
FIG. 10A is a chart illustrating the correlation of the engagement force and different values of overlap between the two solid stems of FIG. 9 for a constant value of the coefficient of friction between the two solid stems of FIG. 9.
Figure 10B:
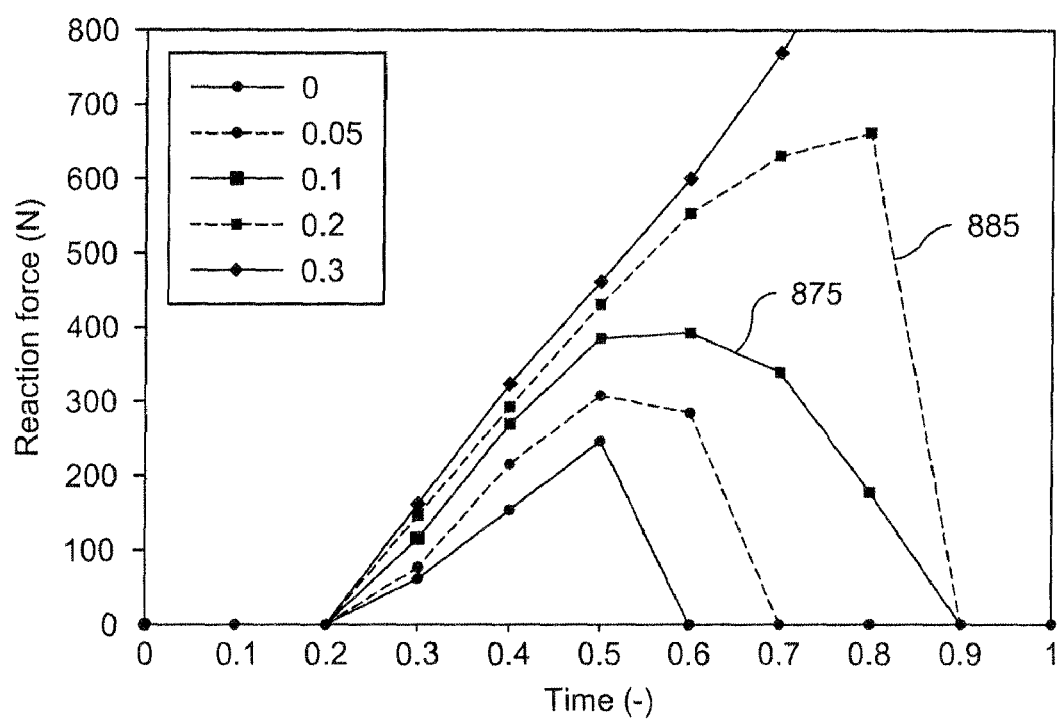
FIG. 10B is a chart illustrating the correlation of the engagement force and different values of coefficient of friction between the two solid stems of FIG. 9 for a constant value of the extent of the overlap between the two solid stems of FIG. 9.

FIGS. 10A, 10B illustrate the correlation between the engagement force, the extent of overlap of two mushroom heads and the coefficient of friction between the two mushroom heads. FIG. 10A illustrates the increase in engagement forces as the extent of overlap increases for a constant coefficient of friction 0.1. FIG. 10A further illustrates that for a coefficient of friction of 0.1, engagement is not possible when overlap is 0.06 times radius R of mushroom head 820, 840 due to friction locking between mushroom heads 820, 840. For instance, curve 870 illustrates the engagement force for an overlap of 0.05 times radius R and curve 880 illustrates the engagement force for an overlap of 0.06 times radius R. Likewise, FIG. 10B illustrates the increase in the engagement forces as the coefficient of friction increases for a constant overlap of 0.05 times radius R of mushroom heads 820, 840. FIG. 10B further illustrates that for a constant overlap of 0.05 times radius R, engagement is not possible when coefficient of friction exceeds 0.2 due to frictional locking between mushroom heads 820, 840. For example, curve 875 represents the engagement force for coefficient of friction of 0.1 whereas curve 885 represents the engagement force for coefficient of friction of 0.2. Thus, for conventional solid stems, friction locking may occur when any of the extent of overlap and the coefficient of friction of the stem material increases beyond a threshold.

An advantage of multiple stems connecting elements with two stalks is that the engagement and disengagement forces are independent of surface coefficient of friction between the stem elements. Therefore, interconnecting bodies with multiple stems connecting elements are not subject to friction locking encountered in the known prior art interconnecting systems with solid stems under certain circumstances. Another advantage of the multiple stems connecting elements is that during engagement, entire second stalk is subjected to deformation. Such deformation of the entire second stalk keeps maximum strains in the second stalk within the material elastic limits. Yet another advantage of the multiple stems connecting elements with first and second stalks is that the engagement and disengagement forces may be controlled by changing the first and second gradients, respectively, of the engagement and disengagement sections.

Another advantage of the multiple stem connecting elements with first stalk is that the pyramidical cap section of the first stalk provides self-aligning mechanism for the plurality of stem elements. Yet further advantage of the pyramidical cap section is that when first and second interconnecting surfaces are superposed and engaged with each other, the pyramidical cap sections are received and accommodated in the indents with opposing surfaces, providing a large contact surface area. Such contact between the stem elements and the opposing surfaces results in achieving enhanced electrical and thermal conductivities between the interconnecting bodies. The disclosed multiple stems connecting elements separate the functionalities of the first stub and second stalk: the second stalk predominantly serves to provide mechanical locking between the two interconnecting surfaces, whereas the first stalk or stub may serve as alignment mechanism as well as to provide one or more of thermal and electrical conductivities between the two interconnecting surfaces. Yet another advantage of the disclosed multiple stems connecting elements is that two articles or substrates with such connecting elements may be engaged and disengaged multiple times without significant loss of tensile and shear holding forces.

According to an embodiment of the invention, first stalk of the stem element may be used for optical conductivity. Optical conductivity may be achieved by embedding graded index lenses, fiber optic waveguides, geometrically shaped lenses, axicons, and hollow-core waveguides into the first stalk. As such, the interconnect system may be utilized for electrical, optical, and a combination of electrical and optical connections therebetween.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. An article of manufacture comprising:
a plurality of regularly spaced connecting elements projecting from a surface of said article,
wherein each connecting element of said plurality of connecting elements comprises:
a first stub projecting substantially orthogonally from said surface and comprising at least one wall and a cap section; and
at least one first stalk projecting substantially orthogonally from said surface, said at least one first stalk being separated from said at least one wall defining a first gap therebetween;
wherein said at least one first stalk comprises:
a stem projecting substantially orthogonally, at a proximal end thereof, from said surface;
a lip section extending from a distal end of said stem, said lip section protruding outwardly relative to said stem; and
an engagement section extending from said lip section, wherein a free end of said engagement section defines a distal end of said at least one first stalk, and wherein an outer surface of said engagement section defines a first gradient.

2. The article of claim 1, wherein said lip section has a first wall thickness,
wherein said first stalk has a second wall thickness at said distal end, and
wherein the wall thickness of said engagement section decreases continuously from said first wall thickness of said lip section to said second wall thickness of said distal end of said first stalk.

3. The article of claim 1, wherein said lip section has a first wall thickness,
wherein said stem has a third wall thickness at said distal end thereof, and
wherein the wall thickness of said lip section decreases continuously from said first wall thickness of said lip section to said third wall thickness at said distal end of said stem.

4. The article of claim 1, wherein said first stub comprises one or more of an electrically conductive material, a thermally conductive material and an optically conductive material.

5. The article of claim 1, wherein an outer surface of said disengagement section has a second gradient defined toward said distal end of said stem in an orientation opposite of said first gradient, wherein said second gradient is greater than said first gradient of said engagement section.

6. The article of claim 1, wherein said wall thickness of said stem at said distal end thereof is greater than said second wall thickness of said distal end of said first stalk.

7. The article of claim 1, wherein said first gradient tapers along at least a portion of the length from said lip section to said distal end of said first stalk.

8. The article of claim 1, wherein said at least one first stalk is substantially parallel to said at least one wall of said first stub.

9. The article of claim 8, wherein said at least one second first stalk comprises a plurality of stalks substantially parallel to said at least one wall of said first stub.

10. The article of claim 8, wherein said first stub comprises a plurality of generally planar walls and said at least one first stalk comprises a plurality of stalks, and wherein each of said plurality of stalks is substantially parallel to a corresponding generally planar wall of said first stub.

11. The article of claim 10, wherein said plurality of stalks comprises a number of stalks equal to the number of said plurality of generally planar walls of said first stub.

12. The article of claim 1, wherein said first stub has a square cross-section.

13. The article of claim 12, wherein said plurality of connecting elements are arranged in a square pattern, such that any four connecting elements of said plurality of connecting elements define the vertices of a square, such that a second central gap is defined therebetween, said second central gap being adapted to receive a connecting element projecting from a second article therein.

14. The article of claim 1, wherein said first stub has a cross-section shape of an equilateral triangle.

15. The article of claim 14, wherein said plurality of connecting elements are arranged in a triangle pattern, such that any three connecting elements of said plurality of connecting elements define the vertices of a triangle, such that a second central gap is defined therebetween, said second central gap being adapted to receive a connecting element projecting from a second article therein.

16. The article of claim 1, further comprising a plurality of regularly spaced indents in said surface, wherein each of said plurality of indents is adjacent to a corresponding connecting element of said plurality of connecting elements, and wherein each of said plurality of indents is adapted to receive said cap section of a corresponding connecting element projecting from a second article.

17. The article of claim 16, wherein said cap section of said first stub comprises a pyramidical cap, and wherein said cap section of said corresponding connecting element projecting from said second article comprises a pyramidical cap.

18. A system comprising:
a first interconnecting article comprising a first plurality of regularly spaced connecting elements projecting from a first surface thereof; and
a second interconnecting article configured for connecting with said first interconnecting article and comprising a second plurality of regularly spaced connecting elements projecting from a second surface thereof,
wherein each connecting element of said first and second pluralities of connecting elements comprises:
a first stub projecting substantially orthogonally from one of said first and second surfaces, said first stub comprising at least one wall and a cap section; and
at least one first stalk projecting substantially orthogonally from the one of said first and second surfaces, said at least one first stalk being separated from said at least one wall defining a first gap therebetween;
wherein said at least one first stalk comprises:
a stem projecting substantially orthogonally, at a proximal end thereof, from the one of said first and second surfaces;
a lip section extending from a distal end of said stem, said lip section protruding outwardly relative to said stem; and
an engagement section extending from said lip section, wherein a free end of said engagement section defines a distal end of said first stalk, wherein an outer surface of said engagement section defines a first gradient, and wherein, when said second article is superposed on said first article such that said cap sections of said second plurality of connecting elements are in general contact engagement with said cap sections of said first plurality of connecting elements, a sub-set of connecting elements of said first plurality of connecting elements defines a second central gap and accommodates a connecting element of said second plurality of connecting elements therein upon application of a first force greater than a first predetermined threshold on at least one of said first and second interconnecting articles, urging the at least one of said first and second articles toward the other of said first and second articles.

19. The system of claim 18, wherein said first gradient tapers along at least a portion of the length from said lip section to said distal end of said first stalk.

20. The system of claim 18, wherein said cap section of said first stub comprises a pyramidical cap.

21. The system of claim 18, wherein, application of a second force greater than a second predetermined threshold on at least one of said first and second articles in a direction opposite of said first force causes said connecting element of said second plurality of connecting elements to be released from said sub-set of said first plurality of connecting elements.

22. The system of claim 21, wherein said second predetermined threshold is greater than said first predetermined threshold.

23. The system of claim 18, wherein said first interconnecting article further includes a first plurality of regularly spaced indents defined in said first surface and interspersed between said first plurality of connecting elements, and said second interconnecting article includes a second plurality of regularly spaced indents defined in said second surface and interspersed between said second plurality of connecting elements.

24. The system of claim 23 wherein when said connecting element of said second plurality of connecting elements is accommodated in said second central gap, said cap section of said connecting element is received in, and in surface engagement with, a corresponding indent of said first plurality of indents.

25. The system of claim 23, wherein each indent of said first and second pluralities of indents is adapted for receiving said cap section of a connecting element projecting from one of said first and second interconnecting articles.

26. An electrical interconnect apparatus comprising:
a substrate; and
a plurality of regularly spaced connecting elements projecting from said substrate;
wherein each connecting element of said plurality of connecting elements comprises:
a first stub projecting substantially orthogonally from said substrate and comprising at least one wall and a section; and
at least one first stalk projecting substantially orthogonally from said substrate, said at least one first stalk being separated from said at least one wall defining a first gap therebetween;
wherein said at least one first stalk comprises:
a stem projecting substantially orthogonally, at a proximal end thereof, from said substrate;
a lip section having a first wall thickness and extending from a distal end of said stem, said first wall thickness being greater than a second wall thickness of said stem at said distal end; and an engagement section extending from said lip section, wherein a free end of said engagement section having a third wall thickness defines a distal end of said first stalk, wherein the wall thickness of said engagement section decreases along at least a portion of the length from said first wall thickness at said lip section to said third wall thickness at said distal end of said first stalk.

27. The apparatus of claim 26, wherein said cap section of said first stub comprises a pyramidical cap.

28. The apparatus of claim 26, further comprising a plurality of regularly spaced indents interspersed between said first plurality of connecting elements, wherein each of said plurality of indents is configured to receive and accommodate a section of a corresponding connecting element projecting from a second apparatus in general contact engagement therewith.

29. The apparatus of claim 28, wherein each of said plurality of indents is adjacent to at least one connecting element of said plurality of connecting elements.

* * * * *

UNITED STATES PATENT AND TRADEMARK OFFICE
CERTIFICATE OF CORRECTION

| | | |
|---|---|---|
| PATENT NO. | : 8,152,549 B1 | Page 1 of 1 |
| APPLICATION NO. | : 12/917118 | |
| DATED | : April 10, 2012 | |
| INVENTOR(S) | : Werner et al. | |

It is certified that error appears in the above-identified patent and that said Letters Patent is hereby corrected as shown below:

Column 12, Claim 9, Line 65, the word "second" should be deleted.

Signed and Sealed this
Twenty-ninth Day of May, 2012

David J. Kappos
*Director of the United States Patent and Trademark Office*